US012787404B2

(12) United States Patent
Yen et al.

(10) Patent No.: US 12,787,404 B2
(45) Date of Patent: Nov. 3, 2026

(54) SILICON CARBIDE SEMICONDUCTOR DEVICE

(71) Applicant: Fast SiC Semiconductor Incorporated, Hsinchu (TW)

(72) Inventors: Cheng-Tyng Yen, Hsinchu (TW); Hsiang-Ting Hung, Hsinchu (TW); Fu-Jen Hsu, Hsinchu (TW)

(73) Assignee: FAST SIC SEMICONDUCTOR INCORPORATED, Hsinchu City (TW)

( * ) Notice: Subject to any disclaimer, the term of this patent is extended or adjusted under 35 U.S.C. 154(b) by 841 days.

(21) Appl. No.: 17/875,158

(22) Filed: Jul. 27, 2022

(65) Prior Publication Data

US 2023/0307507 A1 Sep. 28, 2023

Related U.S. Application Data

(60) Provisional application No. 63/323,575, filed on Mar. 25, 2022.

(51) Int. Cl.
*H10D 64/00* (2025.01)
*H10D 62/10* (2025.01)
(Continued)

(52) U.S. Cl.
CPC ......... *H10D 64/111* (2025.01); *H10D 62/107* (2025.01); *H10D 62/393* (2025.01); *H10D 62/8325* (2025.01)

(58) Field of Classification Search
CPC ............. H10D 30/665; H10D 62/8325; H10D 62/107; H10D 62/111; H10D 64/111; H10D 64/517; H10D 30/66; H10D 62/106; H10D 62/393; H10D 64/519; H10D 84/035; H10D 84/0135; H10D 30/668; H10D 62/127; H10D 62/105; H10D 30/0297; H10D 30/0291; H10D 12/038; H10D 12/441; H10D 12/481; H10D 12/032; H10D 64/256; H10D 30/662; H10D 64/661; H10D 62/109; H10D 64/0115; H10D 64/01366; H10D 64/2527; H10D 30/025;
(Continued)

(56) References Cited

U.S. PATENT DOCUMENTS 4,816,882 A 3/1989 Blanchard et al.
6,104,060 A 8/2000 Hshieh et al.
(Continued)

*Primary Examiner* — Mark W Tornow
*Assistant Examiner* — Priya M Rampersaud
(74) *Attorney, Agent, or Firm* — MUNCY, GEISSLER, OLDS & LOWE, P.C.

(57) ABSTRACT

A silicon carbide semiconductor device has an active area, a termination area surrounding the active area in a plan view. The silicon carbide semiconductor device comprises a SiC substrate, a drift layer, an insulating layer, a polysilicon layer, an interlayer dielectric layer disposed on the polysilicon layer, and a metal layer. The polysilicon layer includes a first portion disposed over the active area and a second portion disposed over the termination area. The metal layer includes a first portion disposed over the active area and a second portion disposed over the termination area. At least one of the second portion of the polysilicon layer and the second portion of the metal layer is configurated to electrically connect to at least one of a gate electrode and a source electrode.

7 Claims, 6 Drawing Sheets

(51) Int. Cl.
*H10D 62/17* (2025.01)
*H10D 62/832* (2025.01)

(58) Field of Classification Search
CPC ........ H10D 30/63; H10D 8/411; H10D 30/65; H10D 30/0281; H10D 84/141; H10D 30/831; H01L 2924/10272
See application file for complete search history.

(56) References Cited

U.S. PATENT DOCUMENTS

| | | | | |
|---|---|---|---|---|
| 9,263,280 | B2 | 2/2016 | Murakawa | |
| 9,385,182 | B2 | 7/2016 | Henning et al. | |
| 9,515,135 | B2 | 12/2016 | Ryu et al. | |
| 10,340,147 | B2 | 7/2019 | Murakawa | |
| 2014/0167068 | A1* | 6/2014 | Stum | H10D 30/0285 257/77 |
| 2015/0108503 | A1* | 4/2015 | Kudou | H10D 62/103 257/77 |
| 2015/0108564 | A1* | 4/2015 | Miura | H10D 12/031 257/329 |
| 2015/0349051 | A1* | 12/2015 | Uchida | H10D 84/01 257/77 |
| 2019/0341308 | A1* | 11/2019 | Urakami | H10D 12/031 |
| 2020/0294989 | A1* | 9/2020 | Okumura | H10D 89/60 |
| 2020/0388695 | A1* | 12/2020 | Sundaresan | H10D 12/031 |

* cited by examiner

SILICON CARBIDE SEMICONDUCTOR DEVICE

CROSS REFERENCE TO RELATED APPLICATIONS

This application claims priority of U.S. Provisional Application No. 63/323,575 filed on Mar. 25, 2022 under 35 U.S.C. § 119(e), the entire contents of all of which are hereby incorporated by reference.

FIELD OF THE INVENTION

The present disclosure relates to a silicon carbide semiconductor device and more particularly to a silicon carbide power semiconductor device.

BACKGROUND OF THE INVENTION

Power semiconductor devices have a finite size, junction termination structures are usually used to avoid high electric field crowded at the edge of power semiconductor device, thus improving breakdown voltage and reducing leakage current. The wide bandgap of silicon carbide (SiC) allow SiC power devices withstand much higher voltage with thinner drift layer. The most commonly used edge terminations include floating guard rings (FGR) and junction termination extension (JTE). FGR are usually multiple separated p-type doped rings formed on the upper surface of n-type drift layer, surrounding the edge of active area of SiC power devices. And JTE are usually one or several lightly-doped p-type regions with different doping concentration; these lightly-doped p-type regions are partially overlapped and surround the edge of active area of the SiC power devices. The edge termination structures occupy a considerable area of SiC power devices. The ratio of area occupied by the edge termination with respect to the total chip area will be higher if the on-resistance of SiC MOSFET is higher because of smaller active area. The doping concentration and thickness of drift layer also affects breakdown voltages of SiC power devices. For example, a SiC MOSFET, with the same active area and termination design, will exhibit a lower on-resistance when the doping concentration of drift layer is higher and the thickness of drift layer is lower.

However, the breakdown voltage will be reduced because of higher doping concentration and lower thickness of drift layer. The more effective the edge terminations in improving breakdown voltage, the better performance of SiC power devices can be achieved.

SUMMARY OF THE INVENTION

A silicon carbide semiconductor device according to an embodiment of the present invention comprises: a SiC substrate of a first conductivity type; a drift layer of the first conductivity type disposed on the substrate; an active area and a termination area formed in the drift layer, the active area including a plurality of transistor cells, and the termination area surrounding the active area; an insulating layer disposed on the drift layer; a polysilicon layer disposed on the insulating layer, comprising a first portion disposed over the active area and a second portion disposed over the termination area; an interlayer dielectric layer disposed on the polysilicon layer; and a metal layer disposed on the interlayer dielectric layer, comprising a first portion disposed over the active area and a second portion disposed over the termination area; wherein at least one of the second portion of the polysilicon layer and the second portion of the metal layer is configurated to electrically connect to at least one of a gate electrode and a source electrode.

A silicon carbide semiconductor device according to an embodiment of the present invention comprises: a SiC substrate of a first conductivity type; a drift layer of the first conductivity type disposed on the substrate; an active area and a termination area formed in the drift layer, the active area including a plurality of transistor cells, and the termination area surrounding the active area; an insulating layer disposed on the drift layer; a polysilicon layer disposed on the insulating layer, comprising a first portion disposed over the active area and a second portion disposed over the termination area, the second portion of polysilicon layer being configured to connect to at least one of a gate electrode and a source electrode; an interlayer dielectric layer disposed on the polysilicon layer; and a metal layer disposed on the interlayer dielectric layer.

A silicon carbide semiconductor device according to an embodiment of the present invention comprises: a SiC substrate of a first conductivity type; a drift layer of the first conductivity type disposed on the substrate; an active area and a termination area formed in the drift layer, the active area including a plurality of transistor cells, and the termination area surrounding the active area; an insulating layer disposed on the drift layer; a polysilicon layer disposed on the insulating layer; an interlayer dielectric layer disposed on the polysilicon layer; and a metal layer disposed on the interlayer dielectric layer, comprising a first portion disposed over the active area and a second portion disposed over the termination area, the second portion of metal layer being configured to connect to at least one of a gate electrode and a source electrode.

DETAILED DESCRIPTION OF THE PREFERRED EMBODIMENTS

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

As used herein, the term "and/or" includes any and all combinations of one or more of the associated listed items.

It will also be understood that when an element such as a layer, portion, region, or substrate is referred to as being "on", "overlie" or "atop" another element, it can be directly on, directly overlie or directly atop the other element or intervening elements may also be present. In contrast, when an element is referred to as being "directly on", "directly overlie" or "directly atop" another element, there are no intervening elements present. Likewise, it will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below", "above", "upper", "lower", "horizontal", "lateral" or "vertical" may be used herein to describe a relationship of one element, layer, portion, or region to another element, layer, portion, or region as illustrated in the figures. It will be understood that these terms and those discussed above are intended to encompass different orientations of the device in addition to the orientation depicted in the figures.

The terminology used herein is for the purpose of describing particular embodiments only and is not intended to be limiting of the disclosure. As used herein, the singular forms "a", "an", and "the" are intended to include the plural forms as well, unless the context clearly indicates otherwise. It will be further understood that the terms "comprises", "comprising", "includes", and/or "including" when used herein specify the presence of stated features, elements, and/or components, but do not preclude the presence or addition of one or more other features, elements, components, and/or groups thereof. The indefinite articles and the definite articles shall encompass both the plural and singular unless the opposite is clearly apparent from the context.

Figure 1:
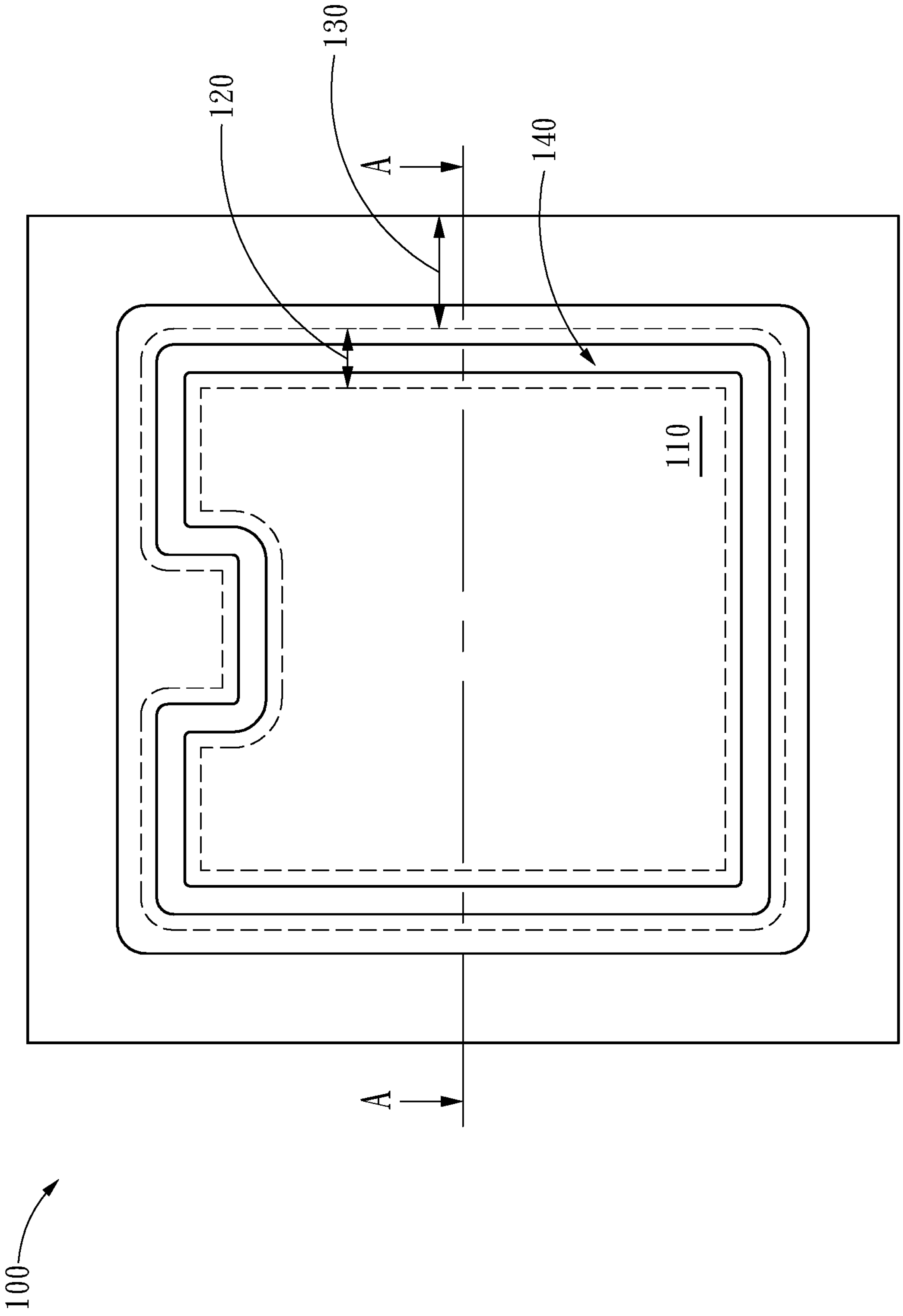
FIG. 1 shows a schematic plan view of a silicon carbide semiconductor device according to a first embodiment of the present disclosure.

FIG. 1 shows a schematic plan view of a silicon carbide semiconductor device 100 according to a first embodiment of the present disclosure. The device 100 includes an active area 110 configured to act as a field effect transistor, for example, a metal-oxide-semiconductor field effect transistor (MOSFET), which includes a gate electrode, a drain electrode and a source electrode, in which a current flowing between drain and source (Id) can be controlled by the bias exerted between the gate electrode and the source electrode (Vgs). The active area 110 is placed at a center portion on a SiC substrate as an example of a semiconductor layer. On the circumferential edge portion of the active area 110, along the outer circumference thereof, a termination area in the square ring with rounded-corner-shape are formed. The termination area comprises a main junction region 120 and an edge region 130 adjacent to the main junction region 120.

Figure 2:
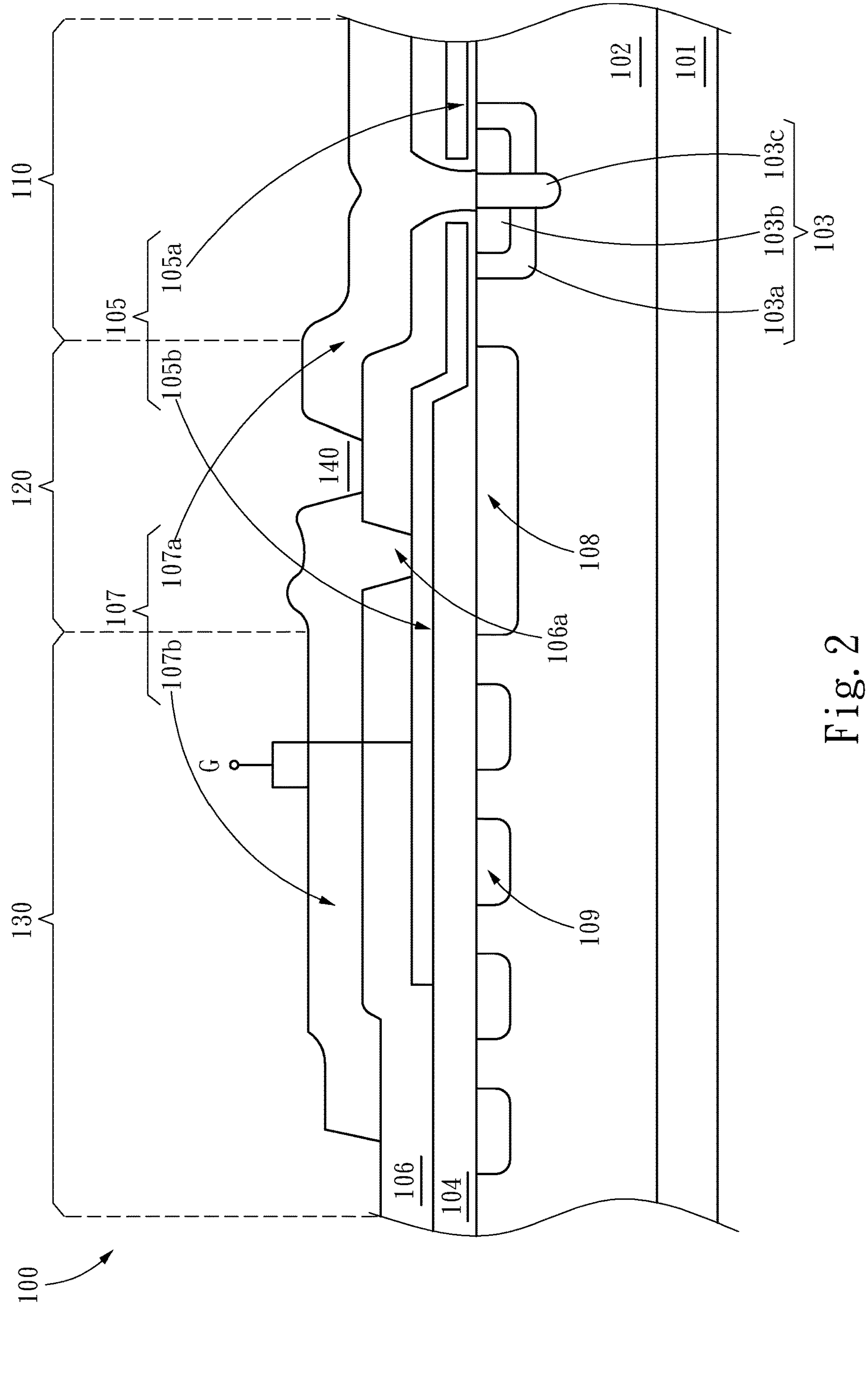
FIG. 2 shows a cross-sectional view of the silicon carbide semiconductor device according to a first embodiment of the present disclosure.

FIG. 2 shows a cross-sectional view of the silicon carbide semiconductor device 100, where FIG. 2 shows a cutting plane taken along a cutting plane line A-A in FIG. 1.

The semiconductor device 100 includes a SiC substrate 101, a drift layer 102, a plurality of transistor cells 103, an insulating layer 104, a polysilicon layer 105, an interlayer dielectric layer 106 and a metal layer 107.

The SiC substrate 101 has a first conductivity type (e.g., n-type). The drift layer 102 is disposed on the substrate 101 and may have the first conductivity type. The transistor cells 103 are formed in the drift layer 102. Each of the transistor cells 103 includes a first well region **103*a*, a source region 103*b* and a doped region 103*c*. The first well region 103*a* is formed in the drift layer 102 and may have a second conductivity type (e.g., p-type). The source region 103*b* is formed in the first well region 103*a* and may have the first conductivity type. The doped region 103*c* is formed in the first well region 103*a* and surrounded by the source region 103*b*. The doped region 103*c*** may have the second conductivity type.

The transistor cells 103 are disposed substantially evenly and substantially uniformly at a surface of the active area 110. In one preferred embodiment, the transistor cells 103 is configured to form a MOSFET device. However, the silicon carbide semiconductor device 100 may more generally be any type of device such as a double implanted field effect transistor (DIMOSFET), a trench metal-oxide-semiconductor field effect transistor, an insulated gate bipolar transistor (IGBT) and the like.

The main junction region 120 and the edge region 130 are regions between the active area 110 and an end of the silicon carbide semiconductor device 100, and surrounds a periphery of the active area 110. The main junction region 120 comprises a second well region 108 and the edge region 130 comprises a plurality of guard rings 109. The second well region 108 has the second conductivity type. The second well region 108 and the guard rings 109 are formed across the entire circumference of the drift layer 102 to surround the active area 110. The main junction region 120 and the edge region 130 is an edge termination structure formed in the drift layer 102 that mitigates electric field at a front side of the substrate 101 and sustains a blocking voltage. The blocking voltage is a rated voltage limit at which no errant operation or destruction of an element occurs. The blocking voltage is usually lower than a real breakdown voltage of the device at which the avalanche effect happens. For example, for a SiC MOSFET rated at 650V of blocking voltage, the breakdown voltage may range between 660V to 800V, depending on an operation margin required. The guard rings 109 are formed in a similar shape to the structure of the main junction region 120, and are placed outside the active area 110 at an interval with the main junction region 120 and the active area 110.

One skilled in the art will recognize that the silicon carbide semiconductor device 100 according to the present invention is not limited to the illustrations in FIG. 2, it is also applicable to the transistor cells with different forms of edge termination structures including floating guard rings, single or multiple JTE terminations, and the combination of guard rings and JTEs. Only four guard rings are depicted as the plurality of guard rings, however, the plurality of guard rings may be less or more than four.

The polysilicon layer 105 overlies the insulating layer 104 and comprises a first portion **105*a* and a second portion 105*b*. The first portion 105*a* of the polysilicon layer 105 is disposed over and extends along a portion of the active area 110, while the second portion 105*b* of the polysilicon layer 105 is disposed over and extends along a portion of the main junction region 120 and the edge region 130**.

The interlayer dielectric layer 106 formed atop the insulating layer 104 and the polysilicon layer 105. The metal layer 107 overlies the interlayer dielectric layer 106 and comprises a first portion **107*a* and a second portion 107*b*. An opening area 140 is formed between the first portion 107*a* and the second portion 107*b* of the metal layer 107 to separate the first portion 107*a* and the second portion 107*b***.

The first portion **107*a* of the metal layer 107 is disposed over and extends along a portion of the active area 110, while the second portion 107*b* of the metal layer 107 is disposed over and extends along a portion of the main junction region 120 and the edge region 130**.

The second portion 105*b* of the polysilicon layer 105 and the second portion 107*b* of the metal layer 107 are interconnected through an opening 106*a* in the interlayer dielectric layer 106. In this embodiment, both of the second portion 105*b* of the polysilicon layer 105 and the second portion 107*b* of the metal layer 107 are configurated to electrically connect to a gate electrode G. In addition, the second portion 105*b* of the metal layer 105 is acted as a gate runner/a gate bus region of the silicon carbide semiconductor device 100. As shown in FIG. 2, the second portion 107*b* of the metal layer 107 extends laterally and outward beyond the second portion 105*b* of the polysilicon layer 105. The gate runner extends around an outer periphery outside the active area 110 and connects the gate electrode G to a common gate contact or a gate pad.

Technical effect of the present approach is that the gate runner of the silicon carbide semiconductor device 100 is arranged in a region outside the active area 110. Specifically, the gate runner is disposed above the main junction region 120 and the edge region 130 and does not occupy the active area 110. Therefore, the effective size of the active area 110 could be larger relative to typical silicon carbide semiconductor device so as to more effectively reduce the gate resistance.

Furthermore, the second portion 105*b* of the polysilicon layer 105 and the second portion 107*b* of the metal layer 107 are acted as a first field plate and a second field plate respectively, to provide a bi-layered field plate. As a result, the breakdown voltage of the silicon carbide semiconductor device 100 can be further enhanced relative to typical silicon carbide semiconductor device.

Figure 3:
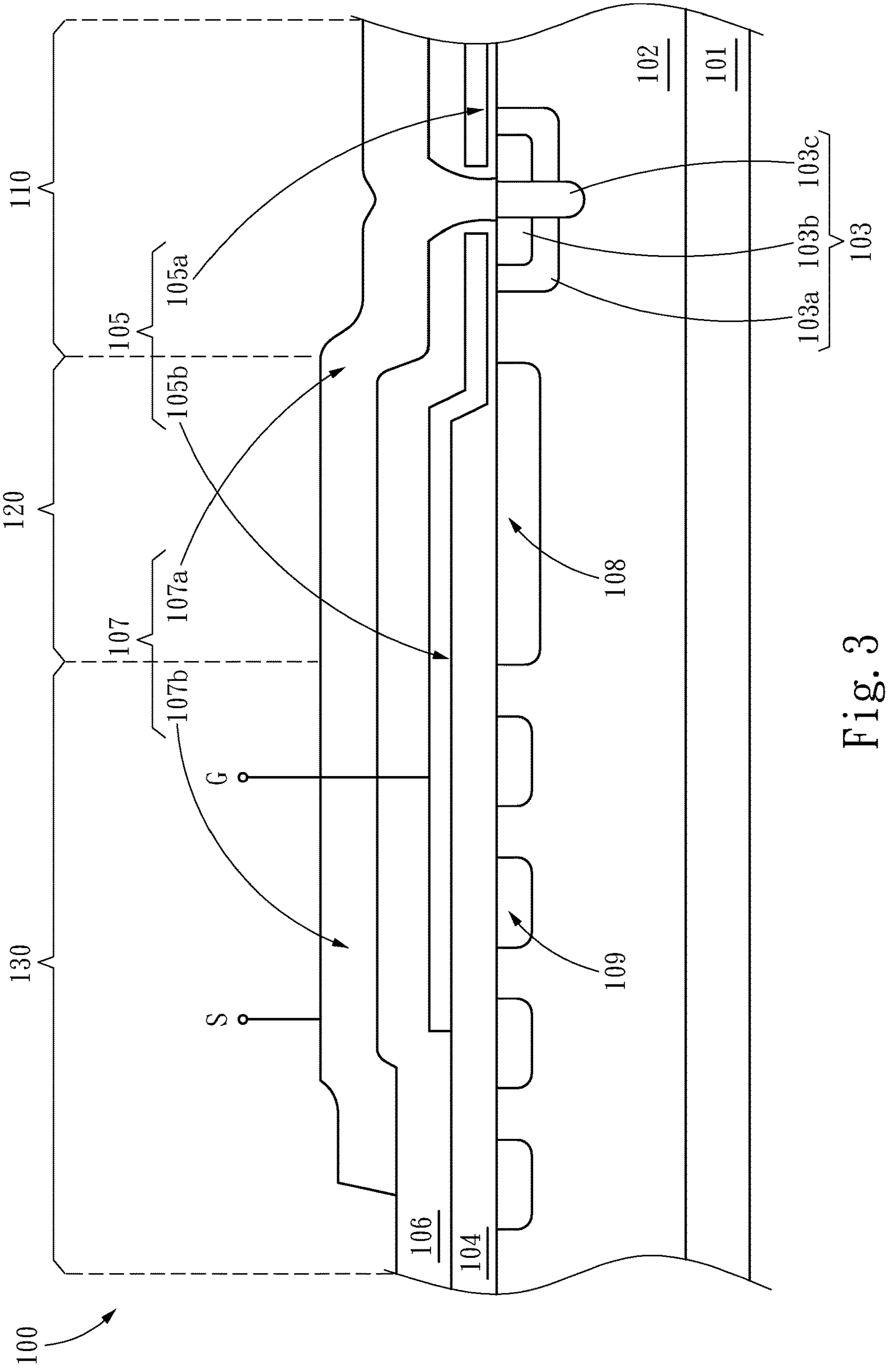
FIG. 3 shows a cross-sectional view of the silicon carbide semiconductor device according to a second embodiment of the present disclosure.
Figure 4:
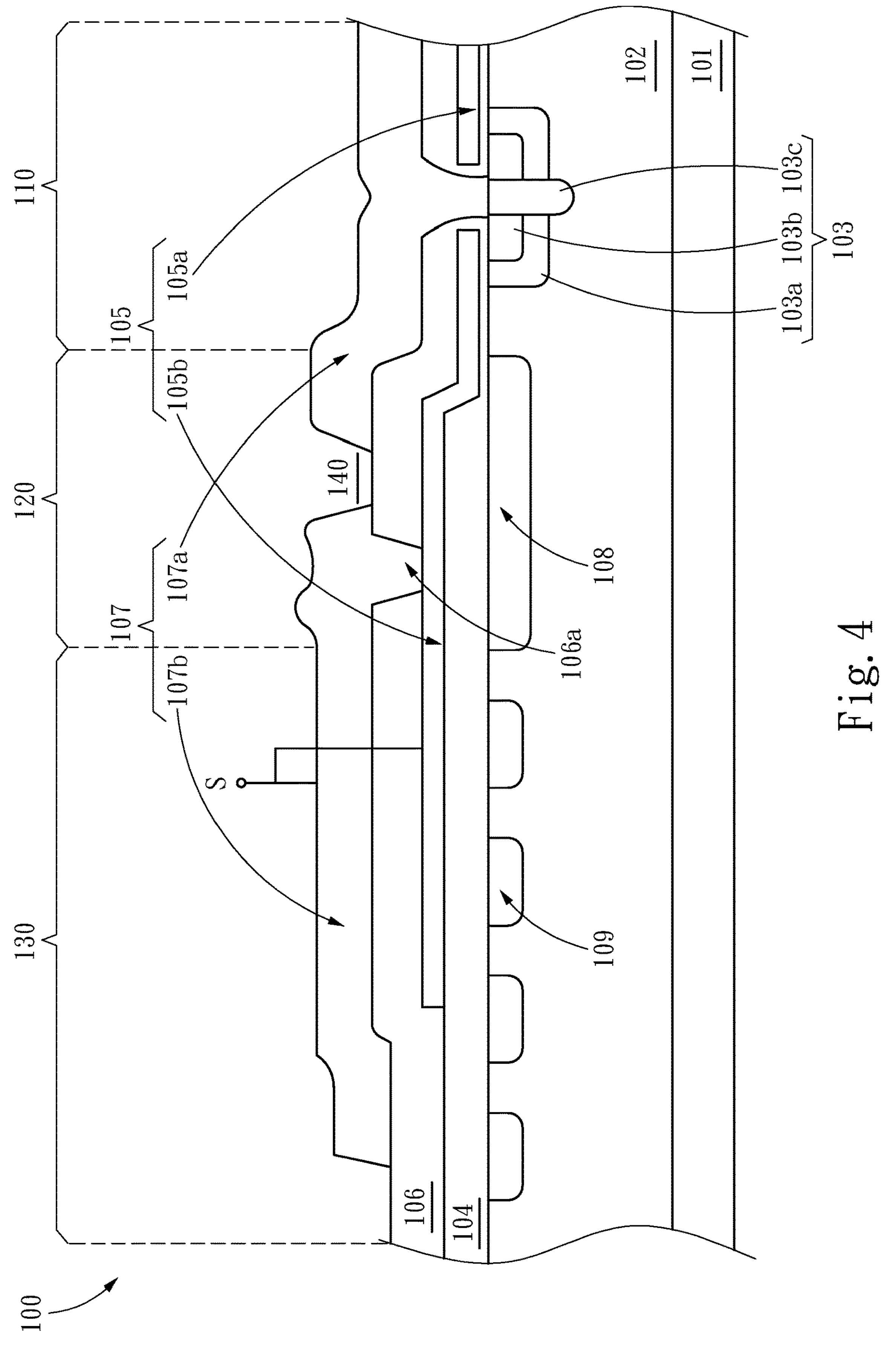
FIG. 4 shows a cross-sectional view of the silicon carbide semiconductor device according to a third embodiment of the present disclosure.

FIG. 3 is a cross-sectional view of the silicon carbide semiconductor device 100 according to a second embodiment of the present disclosure. In this embodiment, only the second portion 105*b* of the polysilicon layer 105 is electrically connected to the gate electrode G. The first portion 107*a* and the second portion 107*b* of the metal layer 107 are electrically connected together, and the metal layer 107 is electrically connected to a source electrode S and isolated from the first portion 105*a* and the second portion 105*b* of the polysilicon layer 105. FIG. 4 is a cross-sectional view of the silicon carbide semiconductor device 100 according to a third embodiment of the present disclosure. In this embodiment, the second portion 107*b* of the metal layer 107 and the second portion 105*b* of the polysilicon layer 105 are electrically connected to the source electrode S.

Figure 5:
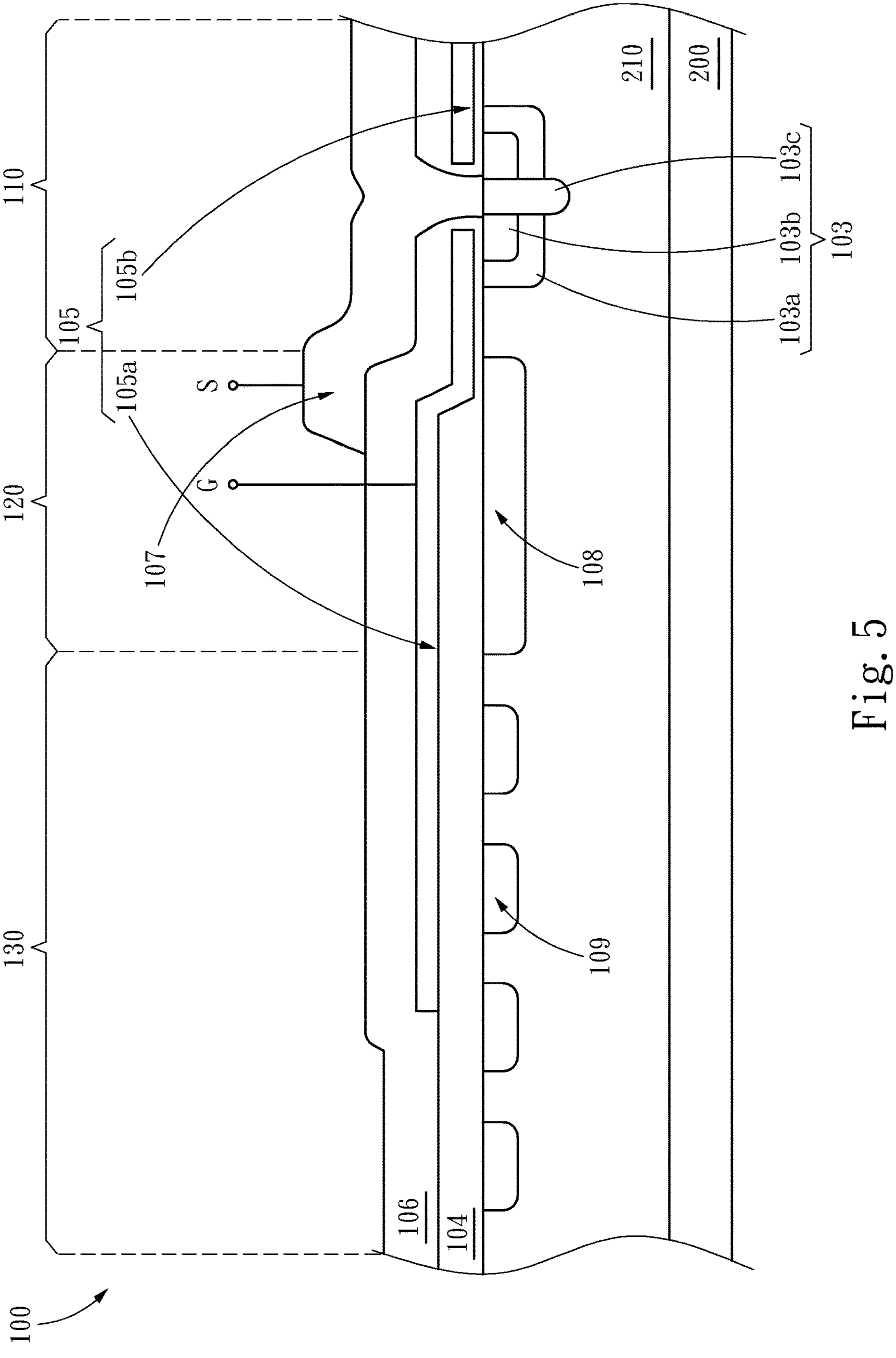
FIG. 5 shows a cross-sectional view of the silicon carbide semiconductor device according to a fourth embodiment of the present disclosure.

FIG. 5 is a cross-sectional view of the silicon carbide semiconductor device 100 according to a fourth embodiment of the present disclosure. In this embodiment, the polysilicon layer 105 comprises the first portion 105*a* disposed over the active area 110 and the second portion 105*b* disposed over the main junction region 120 and the edge region 130, as described in the above embodiments. However, the metal layer 107 only formed atop the active area 110. Namely, the metal layer 107 does not extend to the edge region 130. In this embodiment, the metal layer 107 is electrically connected to the source electrode S, and the second portion 105*b* of the polysilicon layer 105 is electrically connected to the gate electrode G. The metal layer 107 according to FIG. 5 is electrically isolated from the first portion 105*a* and the second portion 105*b* of the polysilicon layer 105. The interconnection of the polysilicon layer 105 is not shown in FIG. 5.

Figure 6:
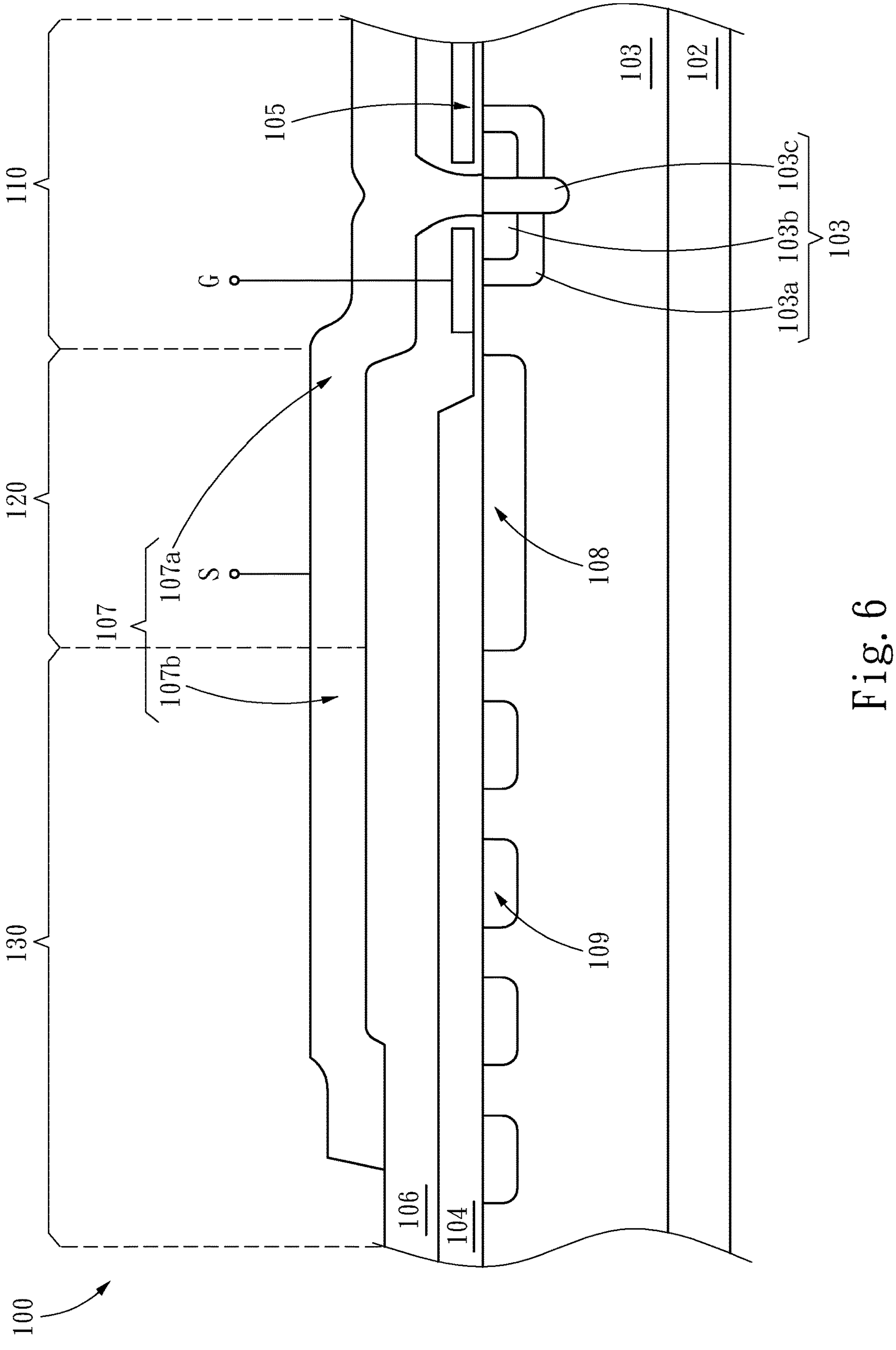
FIG. 6 shows a cross-sectional view of the silicon carbide semiconductor device according to a fifth embodiment of the present disclosure.

FIG. 6 is a cross-sectional view of the silicon carbide semiconductor device 100 according to a fifth embodiment of the present disclosure. In this embodiment, the metal layer 107 comprises the first portion 107*a* disposed over the active area 110 and the second portion 107*b* disposed over the main junction region 120 and the edge region 130, as described in the above embodiments. The first portion 107*a* and the second portion 107*b* of the metal layer 107 are electrically connected together and the metal layer 107 is connected to the source electrode S. However, the polysilicon layer 105 only formed atop the active area 110. Namely, the polysilicon layer 105 does not extend to the edge region 130. In this embodiment, the polysilicon layer 105 is electrically connected to the gate electrode G. The metal layer 107 and the polysilicon layer 105 are electrically isolated and the interconnection of the polysilicon layer 105 to the gate pad is not shown in FIG. 6.

What is claimed is:

1. A silicon carbide semiconductor device, comprising:

a SiC substrate of a first conductivity type;

a drift layer of the first conductivity type disposed on the SiC substrate;

an active area and a termination area formed in the drift layer, the active area including a plurality of transistor cells, and the termination area surrounding a periphery of the active area, wherein the termination area comprises a main junction region and an edge region adjacent to the main junction region, and the main junction region comprises a second well region having a second conductivity type and separated from the plurality of transistor cells, and the edge region comprises a plurality of guard rings disposed in the drift layer;

an insulating layer disposed on the drift layer;

a polysilicon layer disposed on the insulating layer, comprising a first portion disposed over the active area and a second portion disposed over the termination area, wherein the second portion of the polysilicon layer extends from the edge region through the main junction region into the active area;

an interlayer dielectric layer disposed on the polysilicon layer; and a metal layer disposed on the interlayer dielectric layer, comprising a first portion disposed over the active area and a second portion disposed over the termination area, wherein the first portion of the metal layer extends from the active area to the termination area to overlap with the second well region;

wherein at least one of the second portion of the polysilicon layer and the second portion of the metal layer is configured to electrically connect to at least one of a gate electrode and a source electrode; and wherein each of the transistor cells comprises: a first well region of the second conductivity type, disposed on the drift layer; a source region of the first conductivity type, disposed on the first well region; and a doped region of the second conductivity, extending through the source region and the first well region, and contacting the drift layer.

2. The silicon carbide semiconductor device according to claim 1, wherein the second portion of the metal layer extends laterally beyond the second portion of the polysilicon layer.

3. The silicon carbide semiconductor device according to claim 1, wherein the second portion of the metal layer and the second portion of the polysilicon layer are electrically connected to the gate electrode.

4. A silicon carbide semiconductor device, comprising:

a SiC substrate of a first conductivity type;

a drift layer of the first conductivity type disposed on the SiC substrate;

an active area and a termination area formed in the drift layer, the active area including a plurality of transistor cells, and the termination area surrounding a periphery of the active area, wherein the termination area comprises a main junction region and an edge region adjacent to the main junction region, and the main junction region comprises a second well region having a second conductivity type and separated from the plurality of transistor cells, and the edge region comprises a plurality of guard rings disposed in the drift layer;

an insulating layer disposed on the drift layer;

a polysilicon layer disposed on the insulating layer, comprising a first portion disposed over the active area and a second portion disposed over the termination area, the second portion of the polysilicon layer being configured to connect to at least one of a gate electrode and a source electrode, wherein the second portion of the polysilicon layer extends from the edge region through the main junction region into the active area;

an interlayer dielectric layer disposed on the polysilicon layer; and a metal layer disposed on the interlayer dielectric layer, wherein the metal layer extends from the active area to the termination area to overlap with the second well region;

wherein each of the transistor cells comprises: a first well region of the second conductivity type, disposed on the drift layer; a source region of the first conductivity type, disposed on the first well region; and a doped region of the second conductivity, extending through the source region and the first well region, and contacting the drift layer.

5. The silicon carbide semiconductor device according to claim 4, wherein the metal layer and the second portion of the polysilicon layer are electrically connected to the gate electrode.

6. A silicon carbide semiconductor device, comprising:

a SiC substrate of a first conductivity type;

a drift layer of the first conductivity type disposed on the SiC substrate;

an active area and a termination area formed in the drift layer, the active area including a plurality of transistor cells, and the termination area surrounding a periphery of the active area, wherein the termination area comprises a main junction region and an edge region adjacent to the main junction region, and the main junction region comprises a second well region having a second conductivity type and separated from the plurality of transistor cells, and the edge region comprises a plurality of guard rings disposed in the drift layer;

an insulating layer disposed on the drift layer;

a polysilicon layer disposed on the insulating layer, comprising a first portion disposed over the active area and a second portion disposed over the termination area, wherein the second portion of the polysilicon layer extends from the edge region through the main junction region into the active area;

an interlayer dielectric layer disposed on the polysilicon layer; and a metal layer disposed on the interlayer dielectric layer, comprising a first portion disposed over the active area and a second portion disposed over the termination area, the second portion of the metal layer being configured to connect to at least one of a gate electrode and a source electrode, wherein the first portion of the metal layer extends from the active area to the termination area to overlap with the second well region;

wherein each of the transistor cells comprises:

a first well region of the second conductivity type, disposed on the drift layer; a source region of the first conductivity type, disposed on the first well region; and a doped region of the second conductivity, extending through the source region and the first well region, and contacting the drift layer.

7. The silicon carbide semiconductor device according to claim 6, wherein the second portion of the metal layer and the polysilicon layer are electrically connected to the gate electrode.

* * * * *